US011585841B1

(12) United States Patent
Jau

(10) Patent No.: US 11,585,841 B1
(45) Date of Patent: Feb. 21, 2023

(54) LOW-FREQUENCY ATOMIC ELECTROMETRY

(71) Applicant: National Technology & Engineering Solutions of Sandia, LLC, Albuquerque, NM (US)

(72) Inventor: Yuan-Yu Jau, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days.

(21) Appl. No.: 17/531,306

(22) Filed: Nov. 19, 2021

Related U.S. Application Data

(60) Provisional application No. 63/124,957, filed on Dec. 14, 2020.

(51) Int. Cl.
G01R 29/08 (2006.01)

(52) U.S. Cl.
CPC ..... *G01R 29/0885* (2013.01); *G01R 29/0892* (2013.01)

(58) Field of Classification Search
CPC ............. G01R 29/0885; G01R 29/0892
USPC ........................................... 324/96
See application file for complete search history.

(56) References Cited

U.S. PATENT DOCUMENTS 10,509,065 B1 * 12/2019 Shaffer .............. G01R 29/0885
10,605,840 B1 * 3/2020 Amarloo .............. G01J 5/0875
2019/0187198 A1 * 6/2019 Anderson .......... G01R 29/0878

OTHER PUBLICATIONS

Baur, Simon Elias. A Single-Photon Switch and Transistor based on Rydberg Blockade. Diss. Technische Universität München, 2015. (Year: 2015).*
Osterwalder, A. and Merkt, F., "Using High Rydberg States as Electric Field Sensors," Physical Review Letters, 1999, vol. 82, pp. 1831-1834.
Mohapatra, A. K. et al., "Coherent Optical Detection of Highly Excited Rydberg States Using Electromagnetically Induced Transparency," Physical Review Letters, 2007, vol. 98, pp. 113003-1-113003-1.
Mohapatra, A. K. et al., "A Giant Electro-Optic Effect using Polarizable Dark States," Nature Physics, 2008, vol. 4, pp. 890-894.
Viteau, M. et al., "Rydberg Spectroscopy of a Rb MOT in the Presence of Applied or Ion Created Electric Fields," Optics Express, 2011, vol. 19, pp. 6007-6019.

(Continued)

*Primary Examiner* — Christopher P McAndrew
(74) *Attorney, Agent, or Firm* — Martin I. Finston; Mark A. Dodd

(57) ABSTRACT

In a method of atomic electrometry, EIT spectroscopy is performed on host atoms of an alkali metal in a vapor cell. The EIT spectroscopy indicates a resonant energy of a probed Rydberg state of the host atoms. The vapor cell is exposed to an ambient electric field. A shift in the resonant energy as indicated by the EIT spectroscopy is observed and interpreted as a measurement of the ambient field. During the measurement of the ambient field, a bias electric field is generated inside the vapor cell by shining light into the vapor cell from a light source situated outside of the cell. The bias field is useful for increasing the sensitivity of the measurement.

10 Claims, 7 Drawing Sheets

(56) References Cited

OTHER PUBLICATIONS

Cox, K. C. et al., "Quantum-Limited Atomic Receiver in the Electrically Small Regimen," Physical Review Letters, 2018, vol. 121, pp. 110502-1-110502-6.

Sedlacek, J. A. et al., "Microwave Electrometry with Rydberg Atoms in a Vapour Cell using Bright Atomic Resonances," Nature Physics, 2012, vol. 8, pp. 819-824.

Sedlacek, J. A. et al. "Atom-Based Vector Microwave Electrometry Using Rubidium Rydberg Atoms in a Vapor Cell," Physical Review Letters, 2013, vol. 111, pp. 063001-1-063001-5.

Holloway, C. L. et al., "Sub-wavelength Imaging and Field Mapping Via Electromagnetically Induced Transparency and Autler-Townes Splitting in Rydberg Atoms," Applied Physics Letters, 2014, vol. 104, pp. 244102-1-244102-5.

Fan, H. et al., "Atom Based RF Electric Field Sensing," Journal of Physics B: Atomic, Molecular Optical Physics, 2015, vol. 48, 202001, 16 pages.

Miller, S. A. et al., "Radio-Frequency-Modulated Rydberg States in a Vapor Cell," New Journal of Physics, 2016, vol. 18, 053017, 8 pages.

Holloway, C. L. et al., "Electric Field Metrology for Si Traceability: Systematic Measurement Uncertainties in Electromagnetically Induced Transparency in Atomic Vapor," Journal of Applied Physics, 2017, vol. 121, pp. 233106-1-233106-.9.

Meyer, D. H. et al., "Digital Communication with Rydberg Atoms and Amplitude-Modulated Microwave Fields," Applied Physics Letters, 2018, vol. 112, pp. 211108-1-2111081-5.

Wade, C. G. et al., "A Terahertz-Driven Non-Equilibrium Phase Transition in a Room Temperature Atomic Vapour," Nature Communications, 2018, vol. 9, 3567, 7 pages.

Paradis, E. et al., "Atomic Measurements of High-Intensity VHF-Band Radio-Frequency Fields with a Rydberg Vapor-Cell Detector," Physical Review A, 2019, vol. 100, pp. 013420-1-013420-8.

Holloway, C. L. et al., A Multiple-Band Rydberg-Atom Based Receiver / Antenna: AM/FM Stereo Reception, arXiv:1903.00786 (2019), 10 pages.

Meyer, D. H. et al., Assessment of Rydberg Atoms for Wideband Electric Field Sensing, Journal of Physics B: Atomic, Molecular Optical Physics, 2020, vol. 53, 034001, 12 pages.

Kubler, H. et al., "Coherent Excitation of Rydberg Atoms in Micrometre-Sized Atomic Vapour Cells," Nature Photonics, 2010, vol. 4, pp. 112-116.

Abel, R. P. et al., "Electrometry Near a Dielectric Surface Using Rydberg Electromagnetically Induced Transparency," Physical Review A, 2011, vol. 84, pp. 023408-1-023408-5.

Carter, J. D. et al., "Electric-field Sensing Near the Surface Microstructure of an Atom Chip Using Cold Rydberg Atoms," Physical Review A, 2012, vol. 86, pp. 053401-1-053401-7.

Hankin, A. M. et al., "Two-Atom Rydberg Blockade Using Direct 6S to nP Excitation," Physical Review A, 2014, vol. 89, pp. 033416-1-033416-9.

Facon, A. et al., "A Sensitive Electrometer Based on a Rydberg Atom in a Schrödinger-Cat State," Nature, 2016, vol. 535, pp. 262-268.

Sakai, T. "Surface Electrical Resistivity of Aluminum Oxide Ceramics in Cesium Vapor," Japanese Journal of Applied Physics, 1977, vol. 16, pp. 859-860.

Bouchiat, M. A. et al., "Electrical Conductivity of Glass and Sapphire Cells Exposed to Dry Cesium Vapor," Applied Physics B Laser and Optics, 1999, vol. 68, pp. 1109-1116.

Petrov, P. A. et al., "Photodesorption of Rubidium Atoms from a Sapphire Surface," Optics and Spectroscopy, 2017, vol. 123, pp. 574-577.

Jau, Y-Y. and Carter, T., "Vapor-Cell-Based Atomic Electrometry for Detection Frequencies below 1 kHz," Physica Review Applied, 2020, vol. 13, pp. 054034-1-054034-11.

Jau, Y-Y. and Carter, T., "Vapor-Cell-Based Atomic Electrometry for Detection Frequencies below 1 kHz," 2020, SAND2020-1553J, Sandia National Laboratories, Albuquerque, NM.

Abel, R. P. et al., "Electrometry Near a Dielectric Surface Using Rydberg Electromagnetically Inducted Transparency," Physical Review A, 2011, vol. 84, pp. 023408-1-023408-5.

\* cited by examiner

LOW-FREQUENCY ATOMIC ELECTROMETRY

CROSS-REFERENCE TO RELATED APPLICATION

This application claims priority to U.S. Provisional Application Ser. No. 63/124957, filed Dec. 14, 2020 under the title, "LOW-FREQUENCY ATOMIC ELECTROMETRY," the entirety of which is hereby incorporated herein by reference.

ACKNOWLEDGEMENT OF GOVERNMENT SUPPORT

This invention was made with United States Government support under Contract No. DE-NA0003525 between National Technology & Engineering Solutions of Sandia, LLC and the United States Department of Energy/National Nuclear Security Administration. The United States Government has certain rights in this invention.

ART BACKGROUND

The invention relates to apparatus and methods for atomic electrometry.

ART BACKGROUND

Electrometers for sensing electric fields have many important uses. Numerous technologies underlie the operation of electrometers of different kinds. One such technology, which has been of interest for the past several decades, is atomic electrometry based on field-induced shifts in high-lying Rydberg states of atoms.

Rydberg states of high principal quantum number n are associated with relatively high electric dipole moments. Because of that, their energy can be relatively easily perturbed by an applied electric field. Hence, sensitive Rydberg-assisted atomic electrometry is theoretically achievable by performing Rydberg spectroscopy to measure electric field ("E-field") dependent frequency shifts of high-n Rydberg resonances.

Atomic electrometry can be highly sensitive. Theoretically, the fundamental limit of the E-field sensitivity by using Rydberg-assisted atomic electrometry is better than 1 $\mu$V/m per $Hz^{1/2}$ with a detection volume of 1 $mm^3$. No other existing technology can provide such performance.

Atomic electrometry can also be highly accurate, because the E-field driven frequency shifts of Rydberg resonances are determined solely by fundamental constants. Moreover, because the same atoms are indistinguishable at different places, atomic electrometry is suitable for use as a calibration standard.

Rydberg-assisted atomic electrometry has been demonstrated and is known in the art. However, atomic electrometers have been limited in the past to the sensing of electric fields at high radio frequencies. This high-frequency limitation is the result of electromagnetic screening by the film that can form on the inner surface of the envelope that contains the host atoms, when the film has non-zero conductivity. This screening effect becomes more severe, the lower the frequency of the electric field that is to be measured. As a consequence of the screening, atomic electrometers of the prior art are impractical for measuring electric fields of frequencies substantially less than 10 kHz if they are applied from outside the envelope. This is especially true for frequencies of 1 kHz or less.

However, there are many important low-frequency applications for electrometry, particularly in the range from DC to one kilohertz. These applications include remote diagnostics of the charge and voltage states of electronics, proximity detection, surveillance of remote activities, ultra-low frequency communication, geoscience research, and bio-neural signal detection. Rydberg-assisted electrometry has a theoretical sensitivity limit better than 1 $\mu$V/m per $Hz^{1/2}$ with a detection volume of 1 $mm^3$. These applications, and others, would benefit greatly if such a high sensitivity of detection could be applied using Rydberg-assisted electrometry at low frequencies.

SUMMARY OF THE INVENTION

We have found a modification of the vapor cell that drastically reduces the low-frequency screening effect. We have also found a promising new scheme for laser interrogation of the host atoms. We have also found a way to add an electric bias field within the envelope of the vapor cell that enhances the sensitivity of the electrometer at weak signal levels.

In one aspect, the invention relates to a method for measuring an electric field. In embodiments, EIT spectroscopy is performed on host atoms of an alkali metal in a vapor cell. The EIT spectroscopy indicates a resonant energy of a probed Rydberg state of the host atoms. The vapor cell is exposed to an electric field that is to be measured, referred to here as the "ambient field". A shift in the resonant energy as indicated by the EIT spectroscopy is observed and interpreted as a measurement of the ambient field.

During the measurement of the ambient field, a bias electric field is generated inside the vapor cell by shining light into the vapor cell from a light source situated outside of the cell. The bias field is useful for increasing the sensitivity of the measurement.

In electrometry at microwave and radio frequencies, it is feasible to use a super-heterodyne detection scheme in which a controlled field oscillating near the frequencies of interest for detection is radiated into the cell from an external source. This works well at high frequency, because microwave and RF fields will readily penetrate the cell wall.

Because of the E-field screening effect, however, the same approach does not work at low frequencies. Our new approach using an optically induced internal bias field, which may be super-heterodyne at quasi-DC frequencies, overcomes this problem.

It should be noted in this regard that the optically induced bias field has a limited frequency range in which it is useful. That is, it can be used as a DC field, and it can be modulated up to a maximum frequency. However, the bias field arises from photoinduced surface charges, which will not respond at very high modulation rates. For that reason, the maximum modulation frequency of the optically induced bias field will generally be below the RF frequency range.

Because the optically induced bias-field technique is particularly effective at low frequencies, it is most beneficial when used with a vapor cell that has a low screening rate. However, it can be used beneficially with any vapor cell, because it can increase the detection sensitivity irrespective of the E-field screening rate of the cell.

Accordingly, the method in some embodiments is performed using a vapor cell having a screening rate that, in operation, is less than 1 kHz. In examples, the vapor cell is made of sapphire.

In embodiments, the alkali metal is rubidium. In examples, the probed Rydberg state is the rubidium $100S_{1/2}$ state.

In embodiments, the ambient field is an electric field having a frequency less than 1 kHz.

In embodiments, the shift in the resonant energy indicated by the EIT spectroscopy is a Stark shift.

DETAILED DESCRIPTION

Figure 1:
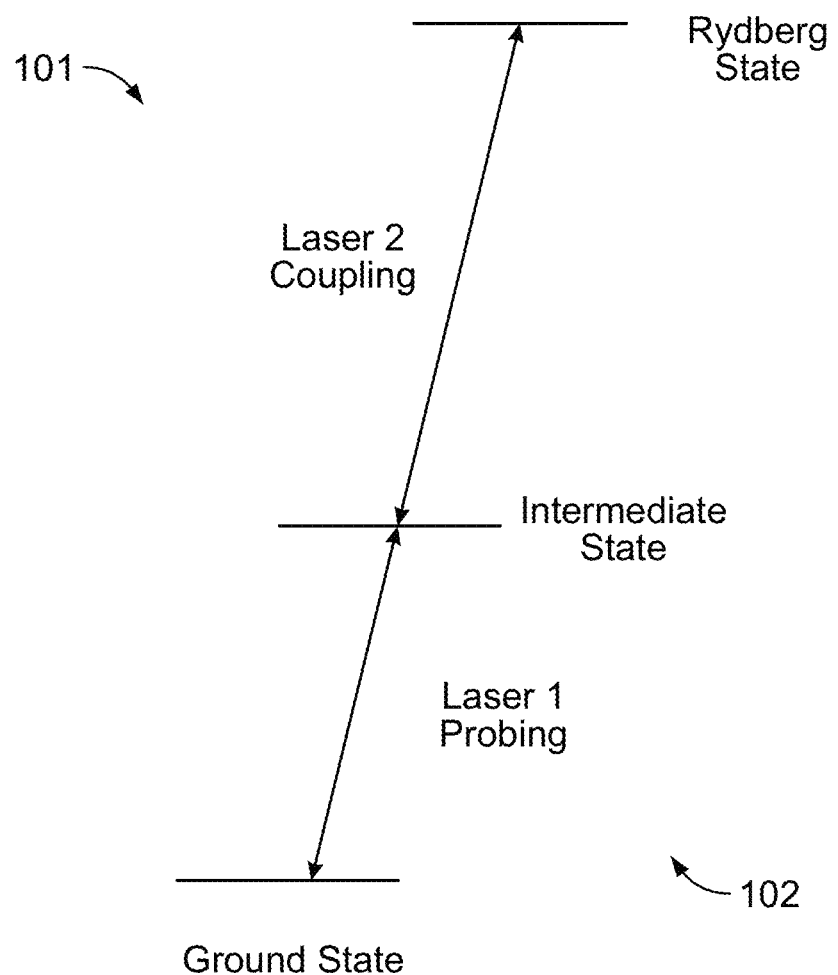
FIG. 1 is a notional atomic energy-level diagram schematically illustrating a stimulated Raman transition.

E-field screening effect. The host atom in an atomic electrometer is typically an alkali metal atom such as rubidium (Rb), because an alkali-metal atom has only one valence electron and can be easily interrogated with existing laser technology. Alkali metals have very low melting points and relatively high vapor pressures. Hence, a large population of free alkali-metal atoms can easily subsist as vapor inside the vapor cell.

Atomic vapor cells for research use as well as for measuring instruments typically use an envelope of silica-based glass to contain the atomic vapor. Silica glass, however, has an affinity for adsorption of alkali-metal atoms. When an alkali-metal vapor is present, an electrically conductive film can therefore form on the inner surface of the vapor cell.

When an external electric field is applied, the free charges on the conductive surface can redistribute and screen the electric field. This is a time-dependent process which, in a simple but useful model, has a time constant $\tau S$ and a screening rate $1/_{\tau S}$. The screening rate imposes an effective cutoff on the E-field frequencies that are able to penetrate into the vapor cell for detection. That is, only fields that oscillate too fast for the free charges to redistribute and accommodate to them can penetrate the adsorbed film. Therefore, the lower the screening rate, the lower the frequency that can be detected. In other words, the lower the screening rate, the closer the passband of the cell approaches DC.

The time constant is proportional to the sheet resistance $R_{sheet}$ of the adsorbed film. A typical value for the sheet resistance in a rubidium-filled silica-based glass cell is 1 MΩ. For a cell about 1 cm³ in volume, we estimate that this leads to a time constant of about 90 ns, which would make it difficult for fields of frequencies less than 1.8 MHz to penetrate into the cell.

To increase the time constant and thereby push the passband closer to DC, it would therefore be desirable to increase the sheet resistance of the adsorbed film. We have combined two approaches to increasing $R_{sheet}$. In one approach, we reduce the surface deposition of alkali-metal atoms by heating up the surface temperature, while also providing a cold finger, or "stem", at a lower temperature where migrating alkali-metal atoms can settle. With that scheme, we were able to increase the sheet resistance in rubidium-filled silica-based glass cells to a value on the order of 1 GΩ.

We achieved a further reduction of the E-field screening effect by choosing an envelope material, or at least a material for the inner surface of the envelope, that reduces the surface adsorption energy of the alkali-metal atoms. We found that sapphire glass ($Al_2O_3$) has a much lower alkali adsorption energy than silica-based glass. With a rubidium-filled sapphire cell, we demonstrated intrinsic inner-surface sheet resistances up to 4.7 TΩ.

Alternative materials may achieve improvements comparable to, or even better than, sapphire. Some possible compositions for the envelope or for a coating on the inner surface of the envelope show promise in that regard because they offer very low adsorption energy. Examples include anti-spin-relaxation coating materials such as paraffin and octadecyltrichlorosilane (OTS).

Interrogation Scheme. We probed Rydberg states of rubidium atoms inside vapor cells using a scheme of stimulated Raman transition.

FIG. 1 is a notional atomic energy-level diagram schematically illustrating a stimulated Raman transition of the kind that could be useful in this regard. As shown in the diagram, there are two participating electronic transitions, labeled the "coupling" transition 101 and the "probe" transition 102. The significance of these transitions will be discussed below.

The scheme of stimulated Raman transition that we have adopted for the work reported here produces the phenomenon of electromagnetically induced transparency (EIT). EIT is known, and it has been widely used for optically detecting Rydberg states of alkali-metal atoms.

However, atomic electrometers operating in the radio-frequency (RF) and microwave frequency regimes rely on Rabi splitting or on the Autler-Townes effect to manifest the E-field perturbation of the Rydberg resonances. By contrast, our new approach relies on the DC or low-frequency AC Stark effect.

In this regard, the Rydberg states of an atom are electronic excited states whose energies obey the well-known Rydberg formula for the energies of hydrogen-like atoms, as corrected by quantum defect theory. These are high-n states whose energies converge to the ionization energy of the atom.

EIT is a coherent optical nonlinearity involving three quantum states of a material. A probe laser tuned near a resonance between the first two of the states measures the absorption spectrum of the transition between those two states. A coupling laser, at an optical power much greater than the probe laser, is tuned near a resonance between a third state and the first or second state. With proper state selection, the coupling field creates a transmissive window within the absorption peak measured by the probe laser. The coupling also produces very strong dispersion, i.e., frequency dependence of the phase velocity of the probe field.

By way of illustration, we interrogated some of the rubidium Rydberg states using a probe laser at 780 nm and a coupling laser at 480 nm. The 780-nm probe laser was locked to one of the $5S_{1/2}$ to $5P_{3/2}$ transitions. With the assistance of a wavemeter, the 480-nm coupling laser was tuned to a transition from the $5P_{3/2}$ level to a selected Rydberg state. The Rydberg state was an nS or nD level that we selected on the basis of calculated optical transition frequencies.

The energy of the Rydberg state is electric-field dependent. A shift in the energy of that state due to an ambient electric field causes a shift in the resonance excited by the 480-nm coupling laser. Because that resonance causes the transmission at the 780-nm probe wavelength to increase, we can observe small shifts in the resonant wavelength by modulating the wavelength (or, equivalently, the optical frequency) of the coupling laser while monitoring the transmission of the probe beam through the rubidium vapor cell. The measured shift in the resonant wavelength can be interpreted to yield a measurement of the ambient electric field.

Figure 2:
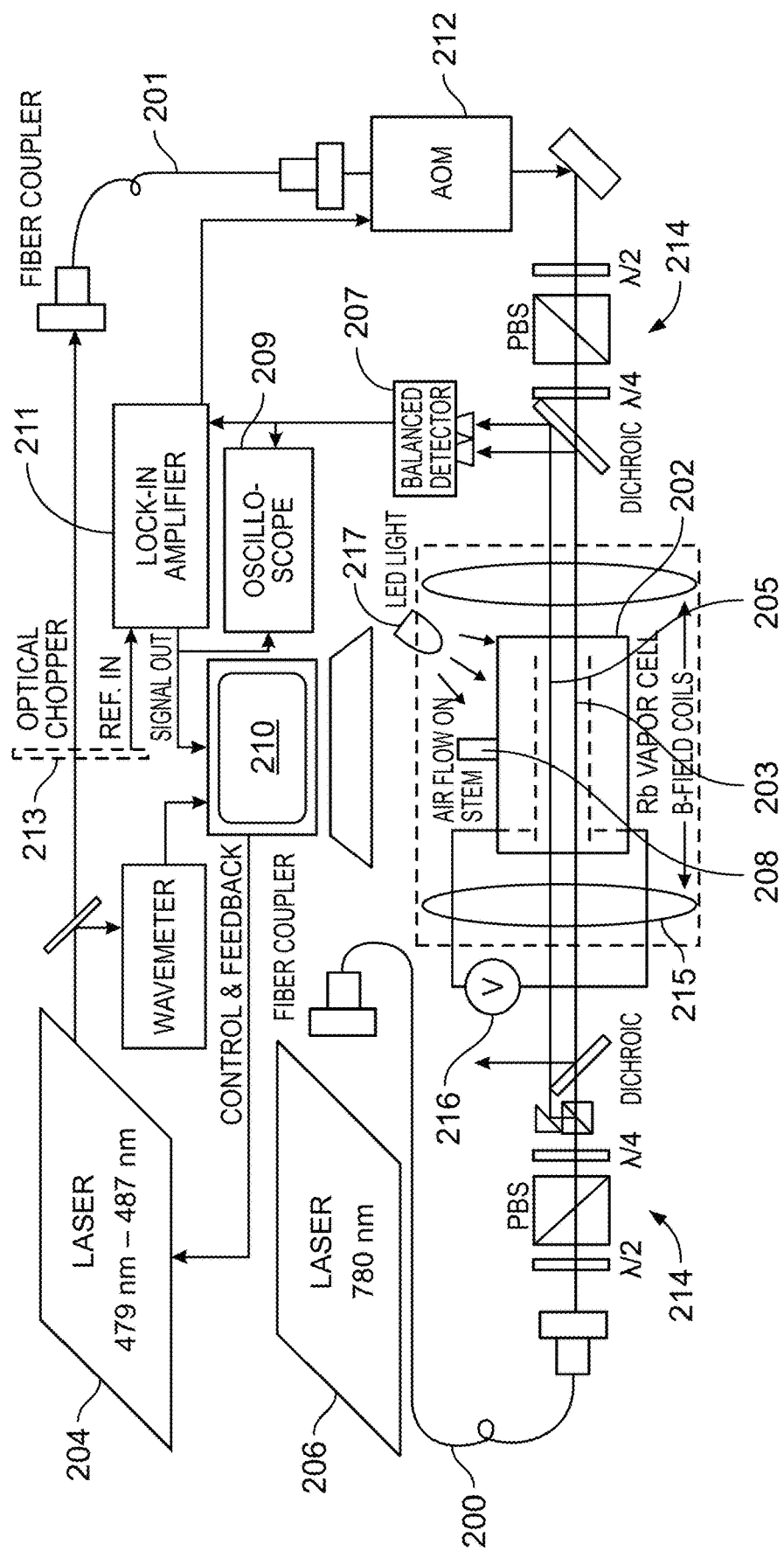
FIG. 2 is a block diagram of an experimental apparatus for measuring E-field-dependent Rydberg resonances.

Experimental Setup. FIG. 2 is a block diagram of an experimental apparatus for measuring E-field-dependent Rydberg resonances. It is also useful for characterizing the screening of external E-fields in vapor cells, and for performing low-frequency atomic electrometry.

In our experimental apparatus, two polarization maintaining (PM) fibers 200, 201 were used to deliver the laser light to the vapor-cell apparatus 202. The beam 203 from coupling laser 204 and the beam 205 from probe laser 206 were aligned to point toward each other collinearly. Polarization optics 214 were used to optimize the signal. A balanced photodetector 207 received the transmitted portion of the main 780-nm probe beam (overlapped with the 480-nm coupling beam). A reference 780-nm beam was used for minimizing the detection noise. The main noise sources were intrinsic intensity fluctuation of the 780-nm probe laser and intensity noise converted by the vapor cell from phase noise of the 780-nm laser.

In our trials, the vapor cells were filled with natural abundance rubidium metal. We pre-treated the vapor cells by heating up the cell body and keeping the cell stem 208, i.e. the "cold finger", cooled so that the rubidium would be driven into the stem, clearing the inner surface of the cell body. We controlled the cell-body temperature by wrapping the vapor cell with heating wires driven by electric current. The cell stem was blown by cold air with an adjustable flow rate.

We used miniature thermocouples to measure the cell-body and the cell-stem temperatures. Once the rubidium metal was collected into the stem, the vapor density was controllable by controlling the stem temperature, provided the stem was cooler than the cell body.

We used oscilloscopes 209 for real-time signal monitoring and quick data acquisition. A computer 210 was used for detailed data acquisition, 480-nm laser control, and 480-nm laser stabilization with a slow feedback loop using a Rydberg resonance when needed.

Also shown in FIG. 2 are magnetic field coils 215 for applying a controllable magnetic field to the vapor cell, voltage source, voltage source 216 for energizing voltage-control electrodes for our experiments, and LED 217 for illumination into the vapor cell through the cell walls.

As explained above, we measured the transmission of the probe beam through a vapor cell while modulating the optical frequency of the coupling laser in the neighborhood of the Rydberg resonance peak. The optical frequency was swept relatively slowly; in a typical run, the optical frequency is swept over a range of several gigahertz at a sweep frequency that is several tens of hertz.

Due to EIT, a DC absorption measurement of the probe beam will typically exhibit a resonance peak interrupted in the middle by a transparent window. In our experiments, however, the absorption is modulated, and we apply a well-known technique in which the detector signal is demodulated using a lock-in amplifier 211. This processing produces a waveform with positive and negative peaks and a zero crossing between them at the Rydberg resonance frequency. We refer to such a waveform as "dispersive-like".

We measure the electric-field-induced frequency shift with reference to the position of this zero crossing. The slope of the waveform at the zero crossing provides a measurement of the absorption signal amplitude at the Rydberg resonance.

The optical frequency of the coupling beam was modulated using acousto-optic modulator (AOM) 212. We could also modulate the intensity of the coupling beam using an optical chopper 213 at a rate of several kilohertz. With intensity modulation, we could observe the original resonance lineshape.

Characterization of the E-Field Screening Effect in a Vapor Cell. As explained above, free charges on the inner surface of a vapor cell tend to redistribute in response to a slowly-varying external electric field externally applied to the cell. The redistribution tends to maintain equal potential on the conductive inner cell surface and null the electric field that is originated externally. A further contribution to this screening effect comes from additional surface free charges that are photoelectrically generated when the vapor cell is exposed to laser beams.

There is a characteristic screening rate that is determined by the speed of charge redistribution. For example, the response $E_i(t)$ of a spherical, thin glass vapor cell of radius r to a suddenly applied external electric field of amplitude $E_e$ is given by $E_i(t)=E_e \cdot \exp(-t/1.5\varepsilon R_S r)$, where $E_i(t)$ is the internal E-field amplitude caused by the external electric field, $\varepsilon$ is the effective electrical permittivity, and $R_S$ is the sheet resistance on the inner surface.

This time response leads to high-pass filtering behavior that can be characterized with a 3-dB low-frequency cutoff $f_{3dB}$. Assuming typical values of $\varepsilon=10^{-11}$ F/m, $R_S$ less than $10^8$ Ω/sq, and r approximately equal to 0.01 m, for example, the resulting E-field screening time constant will be less than about $10^{-5}$ s, and the corresponding $f_{3dB}$ will be greater than about 10 kHz.

It is notable in this regard that the total amount of inner-surface free charge needed to shield a 1 V/m electric field at frequencies below $f_{3dB}$ is only 10' C.

Based on a simple estimate assuming a spherical vapor cell of volume V, the screening time constant is on the order of $\varepsilon R_S V^{1/3}$. This scaling relation is useful for qualitative predictions. The time response can be calculated more precisely with numerical models that take the actual cell geometry into account.

Increasing any of $\varepsilon$, $R_S$, and V can reduce the E-field screening rate. However, increasing the permittivity can also enhance the dielectric shielding effect, which affects the E-field detection not only at low frequencies, but also high frequencies. Increasing the cell volume is also generally undesirable because it increases the overall sensor dimensions, so that spatial resolution is sacrificed. Hence it is most advantageous to increase the sheet resistance.

We consider alumina and sapphire to be good candidate materials for a high-sheet-resistance vapor cell because both are both known to show good resistance to corrosion by alkali-metal atoms and to demonstrate higher surface sheet resistance than silica-based glasses when exposed to alkali vapor.

Accordingly, we conducted experiments to characterize rubidium vapor cells made of fused silica and monocrystalline sapphire. With a sapphire cell, we measured sheet resistances greater than $10^{12}$ $\Omega$/sq when the cell was unexposed to laser beams and sheet resistances greater than $10^{9}$ $\Omega$/sq under irradiation by high-power laser beams. These measurements were made in an atomic electrometer configured for detecting ambient electric fields at frequencies below 1 kHz.

These characterization experiments included measurement of the E-field screening rate $\gamma$ at different cell-body temperatures, different optical power levels $P_{480}$ of the coupling laser, and different optical power levels $P_{780}$ of the probe laser. We found that the screening rate was proportional to $P_{480}$ when other relevant parameters were held constant.

Some of our results are tabulated in Table 1, below. In the first part of the table, the ratio of the screening rate to the coupling laser power is listed for different probe powers and different cell-body temperatures. In the second part of the table, the screening rate $\gamma_0$ at zero coupling power is listed for different probe powers and different cell-body temperatures. In the third part of the table, the sheet resistance $R_{S,0}$ at zero coupling power is listed for different cell-body temperatures.

One feature evident from the table is that the E-field screening rate under non-illuminated conditions could be less than 2 Hz, and in some regimes of cell-body temperature it could even be less than 1 Hz.

Further information about these experiments is provided in Example 2, below.

TABLE 1

| | Probe Power | Cell-Body Temperature | | | Unit |
|---|---|---|---|---|---|
| | | 23° C. | 50° C. | 100° C. | |
| $\gamma/P_{480}$ | 25 µW | 3.21 ± 0.08 | 2.05 ± 0.03 | 1.73 ± 0.06 | s$^{-1}$/mW |
| | 75 µW | 4.32 + 0.10 | 3.71 ± 0.06 | 3.38 ± 0.09 | |
| | 225 µW | 5.73 ± 0.16 | 5.80 ± 0.15 | 5.64 ± 0.17 | |
| $\gamma_0$ | 25 µW | 1.16 ± 0.05 | 0.75 ± 0.05 | 0.58 ± 0.10 | s$^{-1}$ |
| | 75 µW | 1.17 ± 0.06 | 0.79 ± 0.05 | 0.52 ± 0.13 | |
| | 225 µW | 1.16 ± 0.08 | 0.81 ± 0.08 | 0.63 ± 0.08 | |
| $R_{S,0}$ | | 2.34 ± 0.15 | 3.47 ± 0.35 | 4.72 ± 0.94 | $10^{12}$ $\Omega$/sq |

Low-Frequency Atomic Electrometry. Because the Stark effect tends to be stronger for higher-level Rydberg states, we chose to probe the relatively sensitive $100S_{1/2}$ Rydberg state of rubidium in our initial studies of atomic electrometry at low frequencies. The $100S_{1/2}$ state is also desirable for its simple resonance structure.

Figure 3:
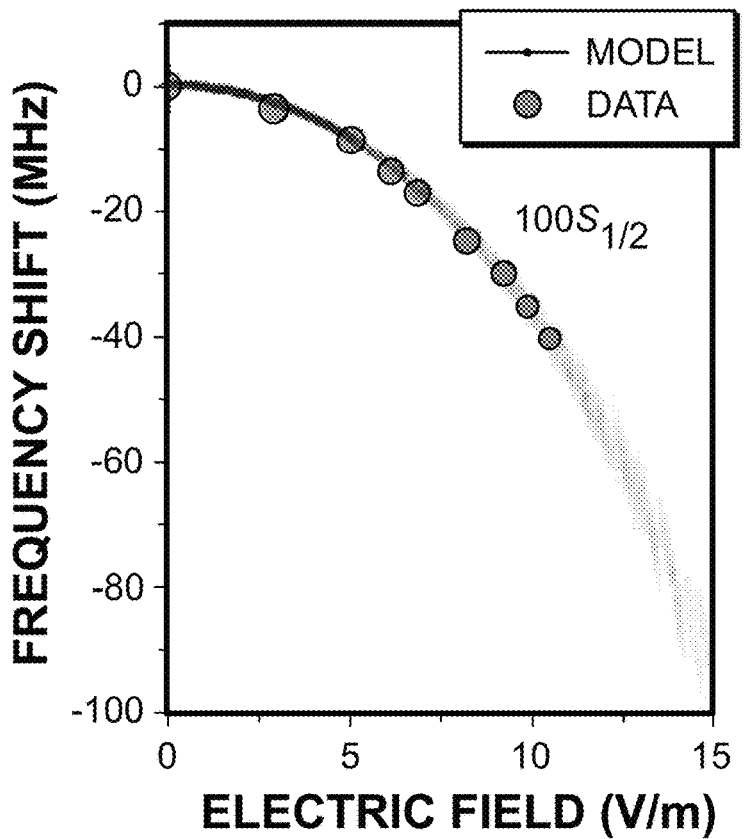
FIG. 3 is a graph of the E-field-dependent shift of the $100S_{1/2}$ state as a function of applied electric field. Experimental data are plotted together with results from numerical modeling.

FIG. 3 is a graph of the E-field-dependent shift of the $100S_{1/2}$ state as a function of applied electric field. Experimental data are plotted together with results from numerical modeling. Broadening of the theoretical curve at higher electric field strength is due to energy levels extended from the Rydberg states of n=97 and l=3 to l=96, which lead to effective broadening of the resonance linewidth.

We will now let $\nu_S$ represent the E-field-dependent frequency shift. The frequency shift depends quadratically on the electric field strength $E_i$ inside the cell according to the relation $$\nu_S = \alpha E_i^2,$$

where the symbol $\alpha$ represents a quadratic shift coefficient proportional to $n^7$.

In the frequency domain, we define a frequency-dependent amplitude $\tilde{E}_i(f)$ for the electric field inside the cell and a frequency-dependent amplitude $\tilde{E}_e(f)$ for the electric field outside the cell. These quantities are related by $$\tilde{E}_i(f) = \tilde{\eta}(f)\tilde{E}_e(f),$$

where $\tilde{\eta}(f)$ is the high-pass electric-field screening factor, and its absolute value is given by $$|\tilde{\eta}(f)| = \frac{f}{\sqrt{f^2 + f_{3dB}^2}}.$$

We performed our experimental trials with circularly polarized laser beams at $P_{780}$=200 µW and $P_{480}$ up to 120 mW, and with a longitudinal bias B-field of 6 G. Additional details are provided below in Example 3.

In terms of the signal-to-noise ratio SNR, it is estimated that the minimum detectable frequency shift will vary in inverse proportion to SNR. Because the frequency shift is quadratic in the E-field, it follows that the minimum detectable E-field will be proportional to SNR$^{-1/2}$. Hence, increasing the SNR in order to detect smaller fields, for example by increasing the 480-nm laser power while holding fixed the 780-nm laser power, will be rewarded only with diminishing returns in sensitivity.

A further difficulty is that sensitivity suffers at lower frequencies irrespective of the shielding effect. Since $\tilde{\eta}(f)$ is proportional to the frequency $f$ when it is much less than $f_{3db}$, it follows that in that frequency regime, the frequency shift $\nu_S$ will be proportional $f^2$. Reducing the frequency thus reduces the response of the measurement apparatus at a rate that is greater than linear, thereby making it more difficult to detect the E-field at the lowest frequencies.

We have implemented an internal bias E-field $E_b$ that mitigates this problem. Under $E_b$, the frequency shift $\nu_S$ remains linearly proportional to the electric field strength, even at very low frequencies.

Specifically, we add a light source that shines light into the cell. Inside the cell, the light creates the bias E-field by photoinduction of surface charges.

In our prototype, the bias E-field is generated by a green light-emitting diode (LED) positioned outside of the cell and arranged to shine focused light onto a particular spot within the cell. The LED generates optically induced surface charges at the illuminated spot. These charges, in turn, give rise to the bias field $E_b$. Photoinduction of this kind has been reported. Reference may be made, for example, to A. M. Hankin et al., "Two-atom Rydberg blockade using direct $6_S$ to np excitation," Phys. Rev. A 89 (2014) 033416.

More specifically, our LED had a central wavelength of about 520 nm and an optical power of several milliwatts.

The wavelength is not critical, but shorter wavelengths tend to be more effective. We used a lens to focus the LED light on one side of the cell. Electric charges were photogenerated on the inner surface of the cell by optical interaction with the residual alkali-metal coatings on the inner surface. It should be noted in this regard that the efficiency of this effect depends on the surface composition, so that different surface materials will give rise to fields with different strengths. It should also be noted that it is not critical to use an LED, specifically, as the light source. A laser, for example, could be substituted for the LED.

We considered how the electrically charged patches generated by the light from the 480-nm laser would affect the electric field within the vapor cell. In our experiments, we did not observe a shift in the resonance as the 480-nm laser power was increased. According to our current belief, the collimated 480-nm laser beam passing through the two cell windows charges patches on either side of the cell about equally, so that the resulting electric field is minimized between the two cell windows.

In this regard, the light from the LED could similarly generate stray surface free charges, but this effect is negligible at the power of the 480-nm laser in normal operation, and it becomes noticeable only when the 480-nm power drops below 1 mW.

Under bias, the internal E-field is the sum of the bias field and the shielded field from external sources. That is, for the frequency-dependent quantities, $$\tilde{E}_I = E_b + \tilde{\eta}\tilde{E}_e,$$

and the resulting frequency shift $\tilde{v}$ given by $$\tilde{v} = \alpha(E_b^2 + 2\tilde{\eta}E_b\tilde{E}_e + (\tilde{\eta}\tilde{E}_e)^*(\tilde{\eta}\tilde{E}_e)),$$

where "*" denotes the infinite convolution in the frequency domain.

It will be evident from the above equation that for weak external electric fields, the frequency shift will be linear in $\tilde{E}_e$ with a proportionality factor $\kappa = 2\alpha\tilde{\eta}E_b$. Here, $\kappa$ is essentially the slope of the curve of FIG. 3 at the electric field strength $E_b$, with $\tilde{\eta} = 1$.

Figure 4:
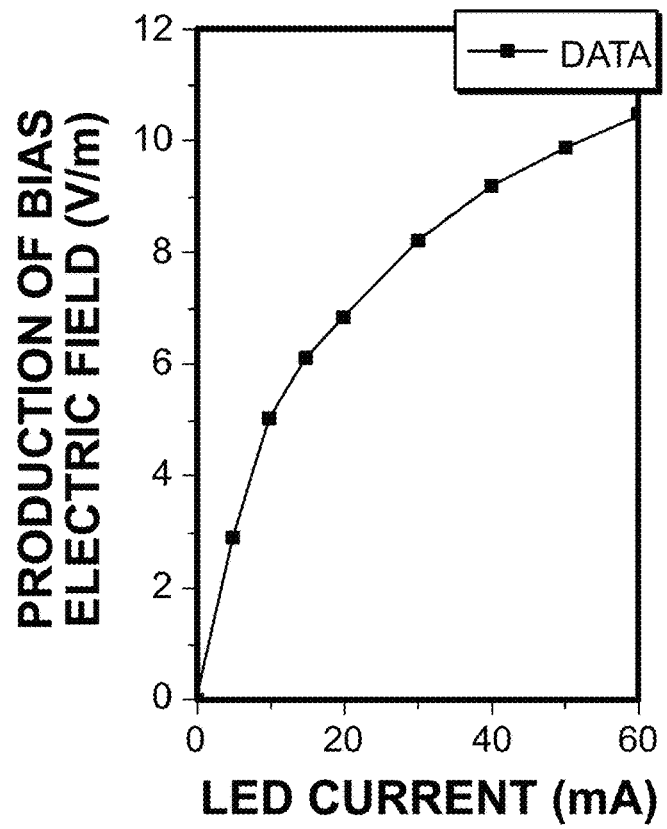
FIG. 4 is a plot of a bias electric field strength that was optically induced within a prototype vapor cell as a function of electric current in an LED light source.

FIG. 4 is a plot of the bias electric field strength that was optically induced within our prototype cell as a function of the LED current.

To perform atomic electrometry, we locked the 480-nm laser to the zero-crossing frequency of the $100S_{1/2}$ resonance with a loop time constant on the order of seconds. Accordingly, we were able to detect electric field signals varying on frequency scales on the order of several Hertz.

Our 480-nm laser system was stable enough over the period of the loop time constant. Changes of the electric-field strength caused shifts in the resonance frequency. We detected these frequency shifts by an indirect method that relies on the linearity of the demodulated optical signal near the zero crossing.

Accordingly, an electrometry signal amplitude $\tilde{V}_{signal}$ is defined by $\tilde{V}_{signal} = \beta\kappa\tilde{E}_e$, and given a spectral noise level $\tilde{V}_{noise}$, an electric field sensitivity $\tilde{E}_{min}$ is defined by $\tilde{E}_{min} = |\tilde{V}_{noise}/\beta\kappa|$.

Figure 5:
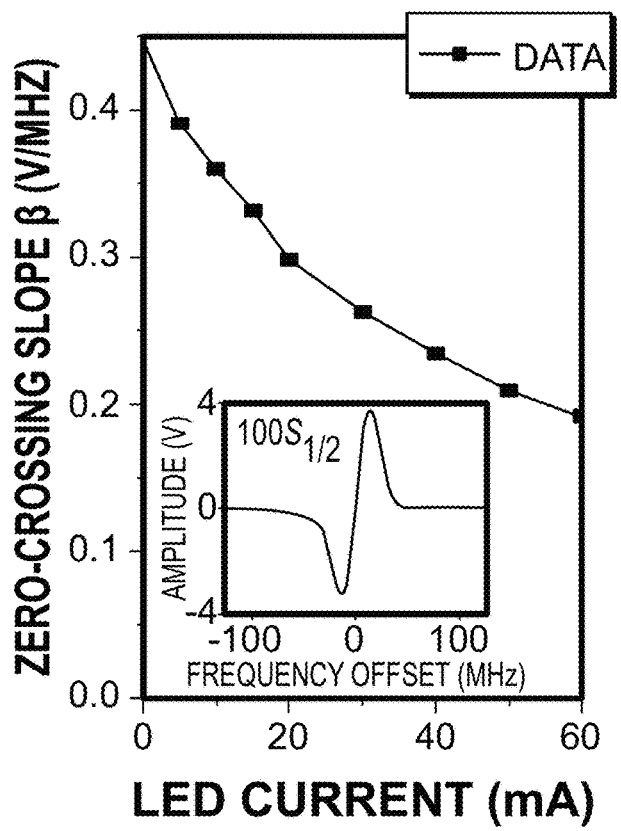
FIG. 5 is a plot of a measured $100S_{1/2}$ resonance signal as a function of electric current in an LED light source. The inset in the figure is the corresponding resonance curve showing the zero crossing at zero E-field bias.

In FIG. 5, we have plotted the measured $100S_{1/2}$ resonance signal as a function of the LED current. As explained above, the zero-crossing slope $\beta$ indicates the signal level. The inset in the figure is the corresponding resonance curve showing the zero crossing at zero E-field bias.

It will be evident from FIG. 5 that the zero-crossing slope decreases with increasing LED current. We attribute this behavior to the linewidth broadening effect discussed above. According to current belief, a principal factor contributing to this line broadening is the spatial gradient of the bias electric field across the probed rubidium atoms within the cell.

One implication of the behavior shown in FIG. 5 is that sensitivity cannot be improved by further increasing the bias electric field. Moreover, the inhomogeneous broadening of the resonance is proportional to the linear response factor $\kappa$. This factor, in turn, is proportional to the quadratic shift coefficient $\alpha$. As noted above, the coefficient $\alpha$ is proportional to the principal quantum number n of the resonant Rydberg state, raised to the seventh power. This implies that going to still higher values of n is also unlikely to improve the sensitivity.

Figure 6:
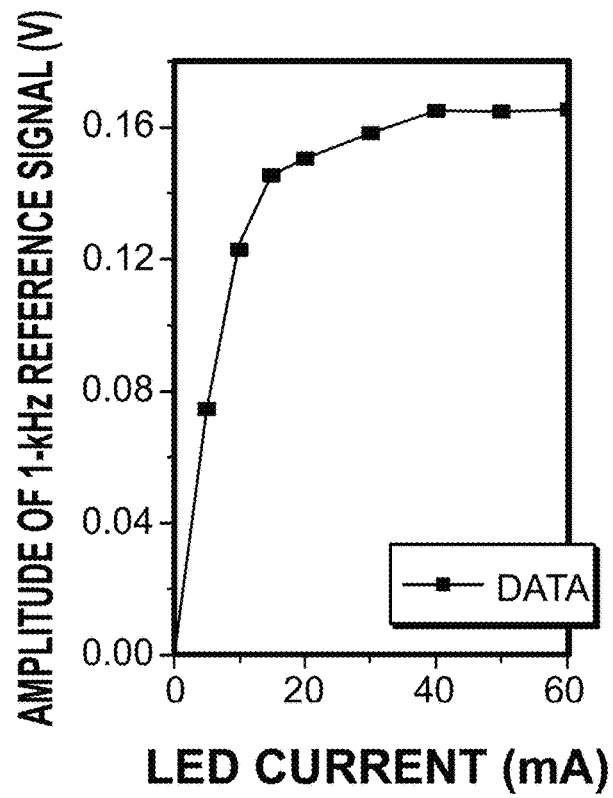
FIG. 6 is a plot of the response of an experimental prototype to a reference signal as a function of LED current.

In FIG. 6, we have plotted the response of our apparatus to a reference signal as a function of the LED current. The reference signal is a 1-kHz electric field applied by a pair of parallel sheets of copper foil situated outside the cell and driven by a sinusoidal voltage source. It will be evident from the figure that above an LED current of about 20 mA, further increases in current did not appreciably increase the signal amplitude. We attribute this saturation behavior to the increasing resonance linewidth, which approaches a value proportional to the bias field as the LED current is increased.

We demonstrated low-frequency (sub-kilohertz) atomic electrometry using a sapphire rubidium vapor cell with an internal bias electric field generated by LED light. In our prototype apparatus, better electric field sensitivity at frequencies greater than 1 kHz can be achieved by simply increasing the power of the 480-nm-laser or increasing the vapor density.

We have considered several approaches for further improvement of the sensitivity at lower frequencies. One approach is to try to produce a more-uniform bias electric field so that the slope $\beta$ of the dispersive resonance signal does not decrease at higher bias. This would enable us to improve the sensitivity by increasing the bias electric field until other mechanisms, such as energy-level mixing, dominate the bias-dependent linewidth broadening.

Another approach is to reduce the power of the coupling laser, and thereby reduce the contributions by photoinduced charge to the electric-field screening rate. This can be done by choosing a coupling transition with a higher oscillator strength.

For example, we could use an $nD_{3/2}$ resonance instead of the $100S_{1/2}$ resonance. That would entail changing the respective EIT laser wavelengths to 795 nm and about 474 nm.

The $100S_{1/2}$ state has a simple resonance structure, which gives rise to a clear "dispersive-like" resonance signal, i.e. a signal with a zero crossing as described above. An $nD_{3/2}$ resonance also has a relatively simple structure, and it can also exhibit a clear dispersive-like resonance signal. There are also $nD_{5/2}$ resonances with more complicated structures, but in the schemes we are considering, excitation of these resonances is suppressed by the selection rule.

A transition from $5P_{1/2}$ to $n'D_{3/2}$ with the same excitation probability and $\kappa$ as the transition from $5P_{3/2}$ to $nS_{1/2}$, with n'<n. It can be achieved with less laser power, and consequently, a lower electric-field screening rate.

Another approach to improving the sensitivity at lower frequencies is to utilize materials for the vapor-cell body or for a coating on the inner surface of the vapor cell that have even lower inner-surface conductivity when exposed to alkali vapor. For example, some anti-spin-relaxation coating materials, such as paraffin and octadecyltrichlorosilane, have relatively low adsorption energies. Hydrocarbon coatings may have some adverse effects on the Rydberg states.

If such effects are tolerable, however, the use of these materials may lead to lower surface conductivity.

Example 1: Characterization of EIT Rydberg Spectroscopy

We performed experiments to characterize the EIT Rydberg spectroscopy of rubidium using a specially designed cell with internal plates to apply the electric field. Because the applied field was internal to the cell, E-field screening was not a factor.

For these experiments, we used a cylindrical vapor cell of fused silica, 25 mm in outer diameter and 50 mm in length. It contained internal plates of stainless steel, approximately 22 mm wide and 44 mm long, and separated by a gap of 2.1 mm.

The 780-nm laser beam was 1 mm in diameter ($1/e^2$) with 20 µW of optical power. The 780-nm laser was locked to F=3 to F=4 of the $^{85}$Rb D2 transition.

The 480-nm laser beam was 1 mm in diameter ($1/e^2$) and chopped at 3.9 kHz, 50% duty cycle, with 50 mW average optical power.

The laser beams were aligned to the gap between the internal metal plates, which were connected to a stable voltage source to produce an E-field perpendicular to the laser beams. A bias magnetic field (B-field) at 2 Gauss along the beam direction was added by B-field coil sets.

Figure 7A:
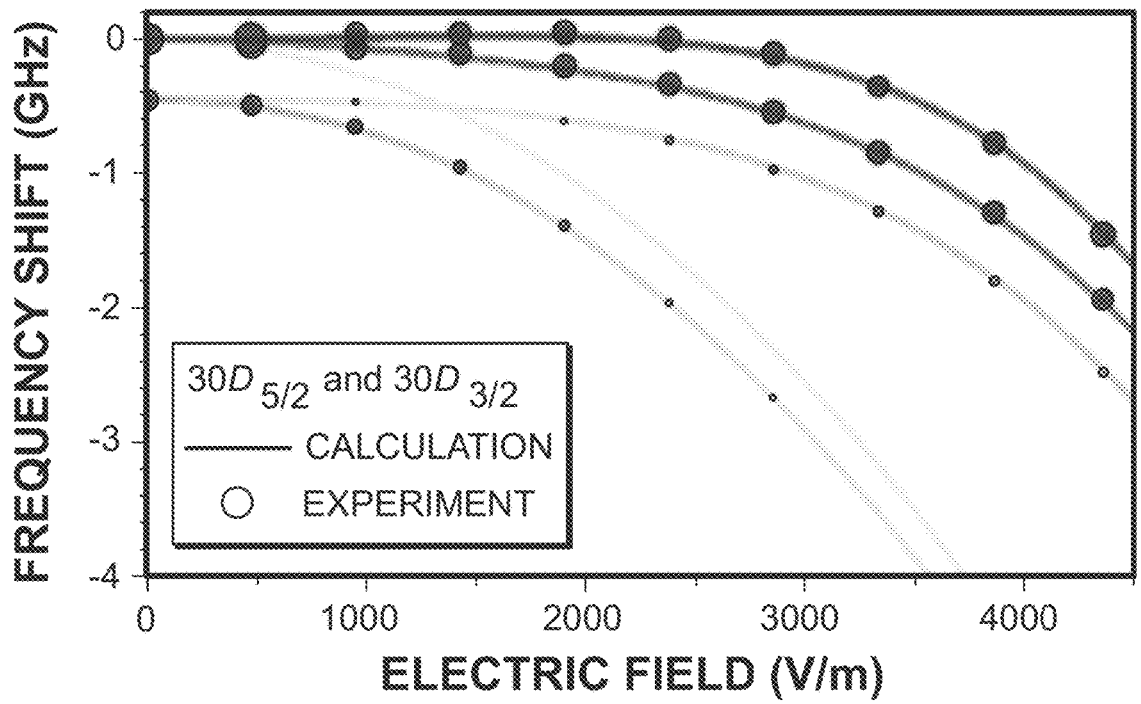
FIGS. 7A and 7B are graphs of resonance energy shift versus electric field strength in an example device of the kind described here. Experimental data are plotted jointly with theoretical results from numerical modeling.
Figure 7B:
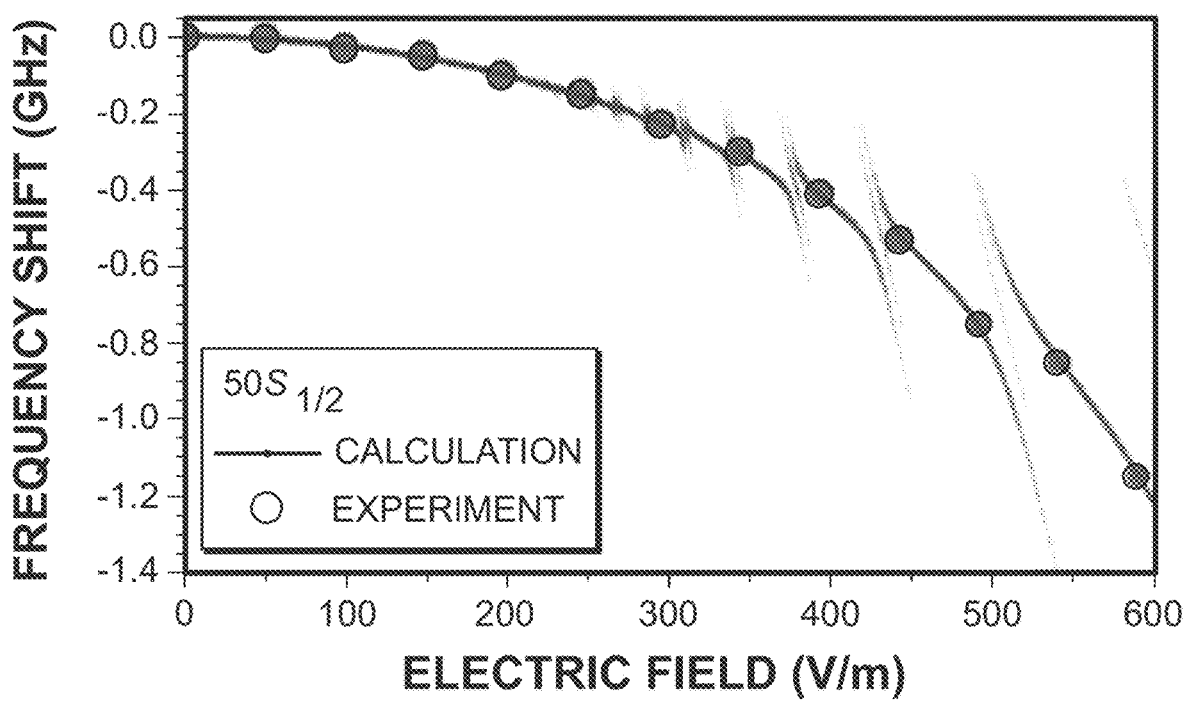

FIGS. 7A and 7B illustrate some experimental data that are plotted jointly with theoretical results from numerical modeling.

In FIG. 7A, the 480-nm laser was tuned to reach the D orbital with principal quantum number n=30, and the optical frequency was slowly swept over a range of several GHz. Two resonances are seen at zero E-field, namely, $30D_{5/2}$ at 0 GHz offset and $30D_{3/2}$ at –0.45 GHz offset. As the E-field is increased, the resonances split into further resonances with different signal strengths. Three resonances are from $30D_{5/2}$, and two are from $30D_{3/2}$.

The resonance linewidth tended to broaden with increasing strength of the E-field. According to current belief, this is due primarily to E-field inhomogeneity that is proportional to the overall E-field strength. Accordingly, we determined the signal strength by measuring the area under each resonance.

The resonance of the lowest frequency from $30D_{5/2}$ was very weak and was not measured.

In FIG. 7B, frequency-shift curves are plotted for the $50S_{1/2}$ state. For this measurement, both 780-nm and 480-nm laser beams were circularly polarized. Many anti-crossing features are seen in the plot for values of the E-field above 200 V/m. According to current belief, this is due to interference with the $50S_{1/2}$ state from energy levels extended from the Rydberg states of n=47 and l=3 to l=46.

Example 2: Experimental Characterization of Screening Effect in Rubidium Vapor Cell Made of Sapphire To characterize the E-field screening effect of a rubidium vapor cell made of sapphire, we applied sudden changes to the externally applied electric field and monitored the frequency shift of the $50S_{1/2}$ Rydberg resonance as a function of time.

The sapphire cell was a 2-cm cube with windows 3 mm thick and an internal volume of 1.43 cm$^3$. The external electric field was produced between two sheets of copper foil that were driven by a square-waveform voltage signal.

Rubidium vapor density was controlled by the cell-stem temperature, which was fixed at 23° C. The cell body was heated with high-resistance heating filaments. The entire cell body was insulated by enclosing all but the cell stem with thin polyimide sheets. The cell-body temperature was set at three different values, 23° C., 50° C., and 100° C.

To probe the Rydberg resonance, we used a 780-nm laser beam 2 mm in diameter ($1/e^2$) and a 480-nm laser beam 1 mm in diameter ($1/e^2$). We used 780-nm laser powers of 25 µW, 75 µW, and 225 µW, and we varied the 480-nm laser power between 0.1 mW and 100 mW.

Figure 8A:
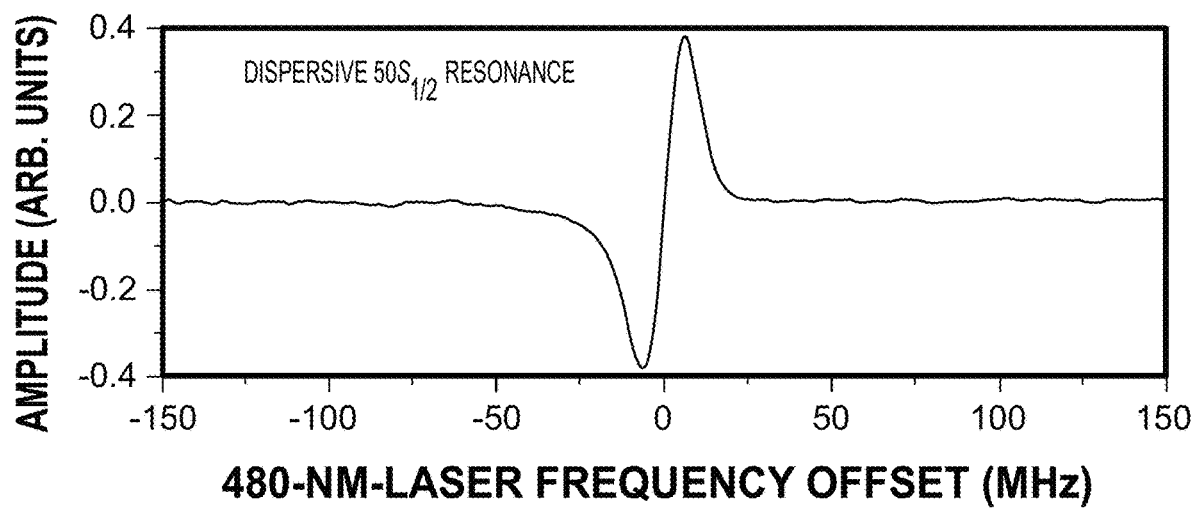
FIG. 8A is an example of a resonance signal produced by an example device of the kind described here.

A double pass AOM dithered the optical frequency of the 480-nm laser beam. An example resonance signal produced by demodulation by a lock-in amplifier is shown in FIG. 8A. The zero crossing of the signal defines the resonance frequency.

Figure 8B:
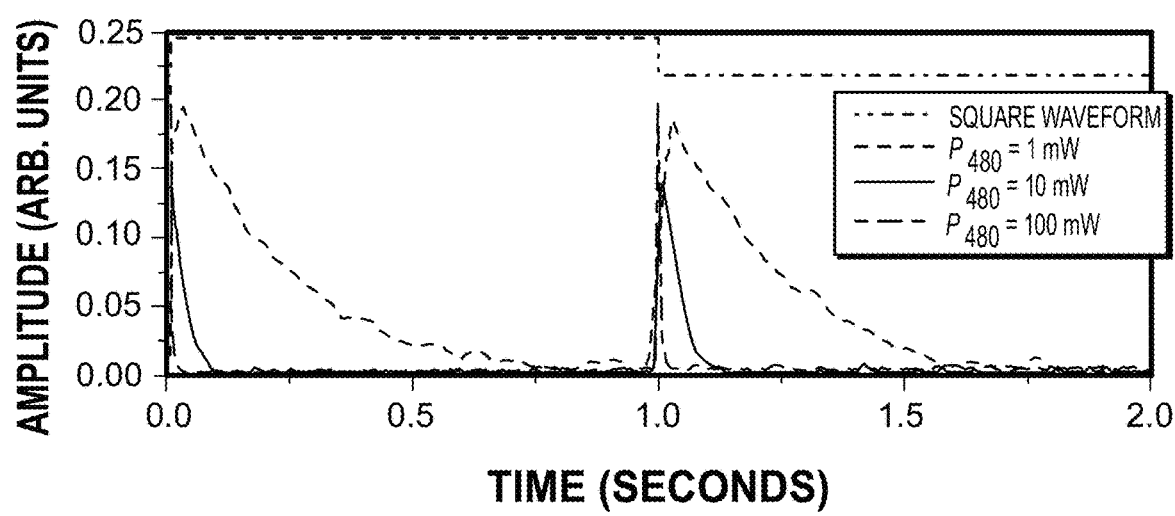
FIG. 8B provides an example of how a resonance frequency evolves in time in a device of the kind described here.

Each step change in the external electric field causes an abrupt jump and a transient decay in the Rydberg resonance frequency as the surface free charges redistribute. FIG. 8B provides an example of how the resonance frequency evolves in time. In the figure, the response of the $50S_{1/2}$ resonance is shown as a function of time at a fixed 780-nm laser powers of 25 µW and three different values of the 480-nm laser power: 1 mW, 10 mW, and 100 mW. As seen in the figure, positive and the negative electric-field transitions cause the resonance to shift in the same direction. That is because for weak applied field, the frequency shift has a quadratic field dependence.

We averaged the transient data from both the positive and the negative half-cycles of the square wave to reduce systematic effects. We fit the data to an exponential decay function with a time constant of $2\gamma t$ to obtain the E-field screening rate $\gamma$. The factor of 2 in front of $\gamma$ is due to the quadratic dependence of the electric field.

Figure 9:
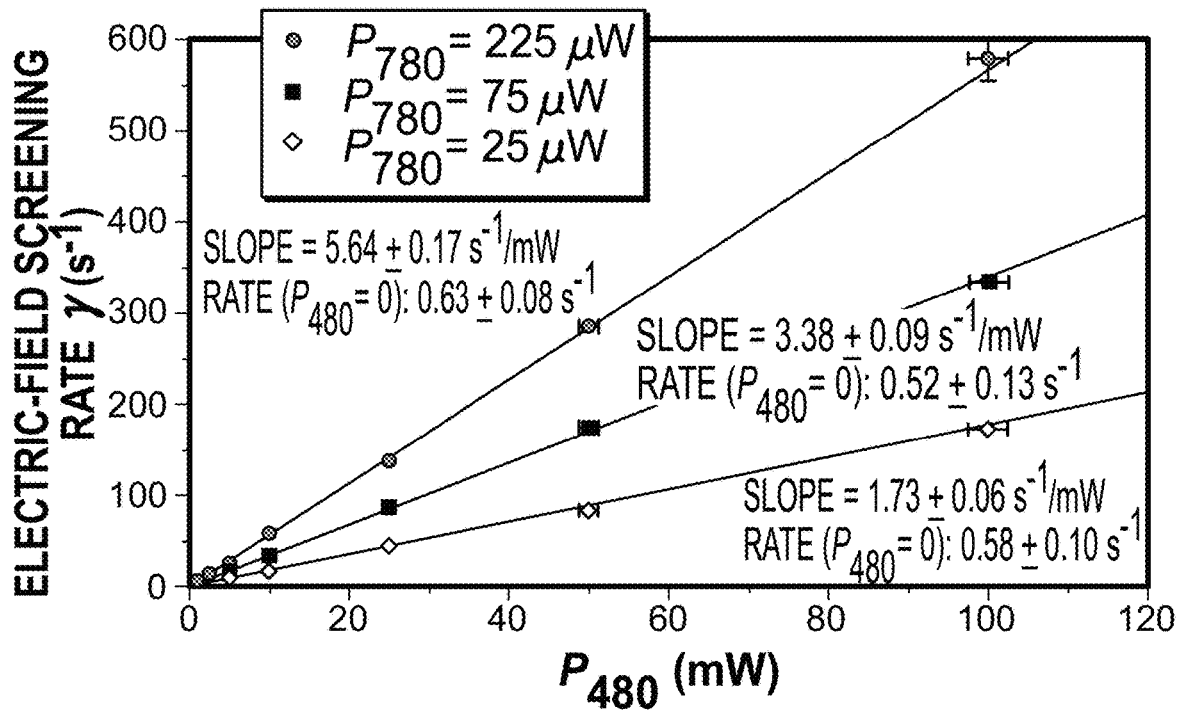
FIG. 9 is a plot of the screening rate of an experimental prototype vapor cell measured at a cell-body temperature of 100° C. for a range of 480-nm laser power levels at fixed 780-nm laser power levels of 25 µW, 75 µW, and 225 µW, respectively.

FIG. 9 is a plot of the screening rate measured at a cell-body temperature of 100° C. for a range of 480-nm power levels at fixed 780-nm power levels of 25 µW, 75 µW, and 225 µW, respectively. It is evident that the E-field screening rate is proportional to $P_{480}$ when other parameters are held constant. It will also be evident that the screening rate increased with $P_{780}$, but only with a nonlinear dependence that grew weaker with increasing optical power.

Screening rates measured under various experimental conditions are listed in Table 1. The screening rates $\gamma_0$ listed in the table were obtained by extrapolation of the measured data to $P_{480}$=0. At a given cell-body temperature, the measured value of yo was roughly independent of the 780-nm laser power.

Finite element modeling predicted a sheet resistance of $2.72 \times 10^{12}$ Ω/sq for the sapphire cell. The values for the zero-optical-power sheet resistance listed in the last row of the table were calculated from our screening-rate measurements. We found that increasing surface temperature leads to increasing sheet resistance.

As Table 1 shows, the intrinsic E-field screening timescale of the sapphire cell used in these studies was on the order of several seconds. Even at relatively high laser powers, $f_{3dB}$ was still less than 100 Hz. Preliminary studies also indicated that under the experimental conditions reported here, the E-field screening rate is proportional to the rubidium vapor density in the cell.

For comparison, we applied similar characterization methods to rubidium vapor cells made of fused silica. We found that the sheet resistance at zero laser power was about three orders of magnitude greater for the sapphire cell than for the silica cells. We also found that the $\gamma/P_{340}$ ratio was much lower for the sapphire cell.

Example 3: Spectral Response of the Low-Frequency Atomic Electrometer

To characterize the spectral response of the electrometer described above, we set the LED current to 40 mA. To address the frequency-dependent screening effect, we took time-dependent signal traces, subjected them to Fourier analysis, and normalized the resulting Fourier spectra to the screening coefficient $\eta_{71}$ defined by the measured $f_{3dB}$.

Figure 10:
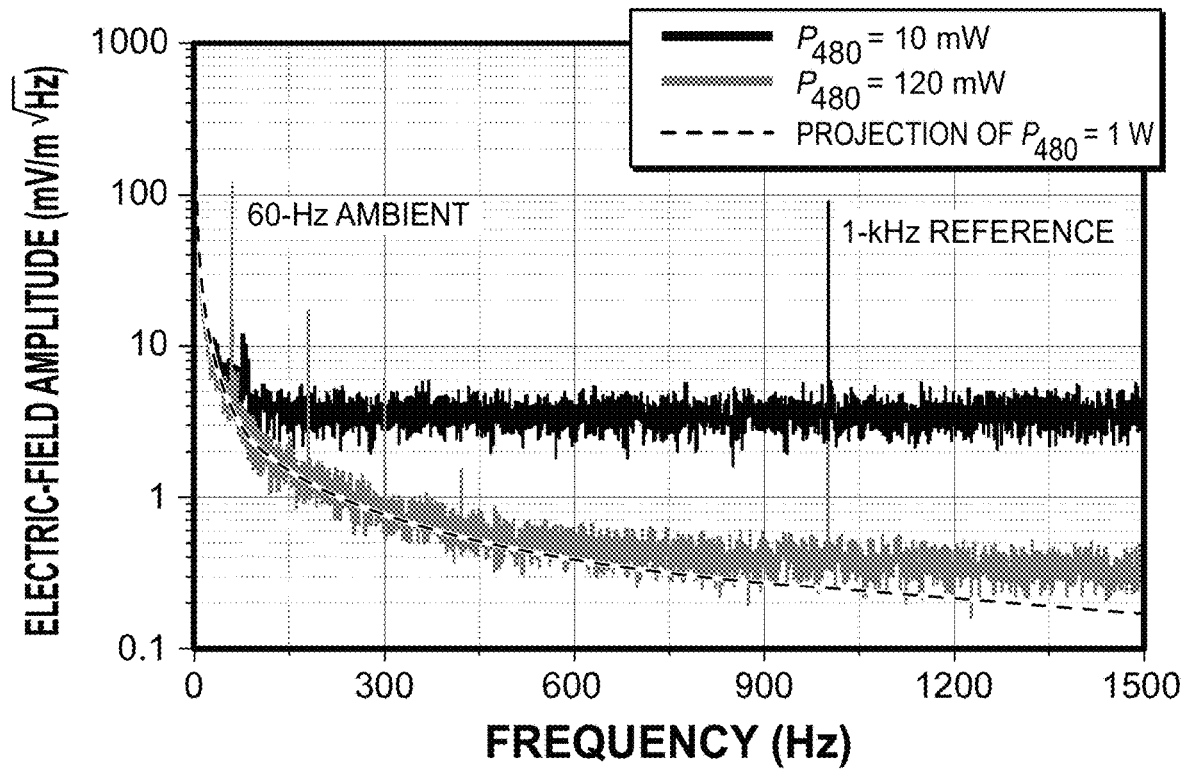
FIG. 10 provides a pair of spectra that were experimentally measured to characterize the frequency response of a prototype electrometer of the kind described here.

In FIG. 10, we have plotted the resulting spectra. The upper spectrum was obtained with a 780-nm laser power of 200 µW and a 480-nm laser power of 10 mW. The lower spectrum was obtained with the same 780-nm laser power of 200 µW, but a 480-nm laser power of 120 mW. For $P_{480}$ of 10 mW, $f_{3dB}$ was determined to be approximately 64 Hz. For $P_{480}$ of 120 mW, $f_{3dB}$ was determined to be approximately 770 Hz.

It should be noted in this regard that the rubidium vapor density and the 780-nm-laser power used in these experiments were different from those used in the experiments, reported above, that led to the parameters listed in Table 1. Consequently, the $f_{3dB}$ values reported here will differ from those that would be deduced from Table 1.

We observed a $\tilde{V}_{noise}$ of 0.065 mV/Hz$^{1/2}$ at the output of the lock-in amplifier. This is about 1.2 times higher than the calculated photon shot noise. This gives an electric-field noise floor of $|6.5\times10^{-3}/\beta\kappa|$ at frequencies above $f_{3dB}$ and assuming a unity screening factor.

For a 40-mA LED current and 120 mW of optical power at 480 nm, we calculate $\kappa=-7.9$ and $\beta=0.24$ V/MHz, giving a noise floor of about 0.34 mV/m-Hz$^{1/2}$, as shown in FIG. 10.

The corresponding active volume for electric-field sensing is about 11 mm$^3$ on the basis of the beam diameter and the 14-mm path length inside the vapor cell.

We verified that the influence of the laser frequency noise on the detection noise floor was insignificant for corresponding experimental conditions. We also verified that noise introduced by the LED-induced bias field was insignificant relative to the measured spectral noise floor, and we verified that the influence from the fluctuation of the bias magnetic field was negligible.

We observed a drift of about 3% in the bias electric field over an interval of seven days with the LED current fixed at 40 mA, which can affect measurements made from shot to shot over a long period. However, it is possible to calibrate the bias field using the associated frequency-shift curve.

The frequency $f_{3dB}$ is proportional to the screening rate $\gamma$, which, as explained above, is proportional to the coupling power $P_{480}$. Hence, increasing $P_{480}$ can increase the sensitivity only at frequencies greater than approximately $f_{3dB}$. Increasing $P_{480}$ is not advantageous for sensing the electric field at frequencies much less than $f_{3dB}$, as will be evident from a comparison between the two spectra shown in FIG. 10.

The maximum achievable 480-nm-laser power in our prototype was 120 mW at the cell. We estimate that boosting this power to a full watt would reduce the electric field noise floor to below 0.1 mV/m-Hz$^{1/2}$ with an $f_{3dB}$ of about 6.4 kHz. However, the sensitivity around the 1-kHz detection frequency improves only slightly, and as indicated by the dashed curve in FIG. 10, there is negligible improvement for a detection frequency below 500 Hz.

I claim:

1. A method for measuring an electric field using a vapor cell containing host atoms of an alkali metal, comprising:
   optically probing a Rydberg state of the host atoms;
   performing EIT spectroscopy to detect a resonance of the probed Rydberg state;
   exposing the vapor cell to an electric field that is to be measured, referred to here as the ambient field;
   by EIT spectroscopy, detecting an energy shift of the resonance due to the ambient field; and
   while detecting the energy shift, generating a bias electric field inside the vapor cell by shining light into the vapor cell from a light source situated outside of the vapor cell, the bias electric field due to surface charges photoinduced by the light from the light source.

2. The method of claim 1, performed using a vapor cell that in operation has an electric field screening rate less than 1 kHz.

3. The method of claim 1, performed using a vapor cell made of sapphire.

4. The method of claim 1, wherein the alkali metal is rubidium.

5. The method of claim 1, wherein the alkali metal is rubidium and the probed Rydberg state is the rubidium $100S_{1/2}$ state.

6. The method of claim 1, wherein the measuring of an electric field comprises measuring an ambient field that has a frequency less than 1 kHz.

7. The method of claim 1, wherein the EIT spectroscopy is performed to detect a Stark shift in the resonance of the probed Rydberg state.

8. The method of claim 1, wherein the EIT spectroscopy comprises using a probe laser to probe an optical absorption peak between a first and a second quantum state of the host atoms, while using a coupling laser to impinge the host atoms with light tuned near a resonance between a third quantum state of the host atoms and the said first or second quantum state.

9. The method of claim 1, further comprising, while detecting the energy shift, maintaining a cold finger of the vapor cell at a lower temperature than all other portions of the vapor cell.

10. The method of claim 1, wherein the light shined into the vapor cell from a light source situated outside of the vapor cell is focused onto a spot on a side of the vapor cell.

* * * * *